(12) United States Patent
Bring et al.

(10) Patent No.: US 7,981,303 B2
(45) Date of Patent: Jul. 19, 2011

(54) METHOD OF MANUFACTURING MONOCRYSTALLINE SILICON MICROMIRRORS

(75) Inventors: Martin Bring, Langebrück (DE); Peter Enoksson, Mölndal (SE)

(73) Assignee: Micronic MyData AB, Taby (SE)

( * ) Notice: Subject to any disclaimer, the term of this patent is extended or adjusted under 35 U.S.C. 154(b) by 339 days.

(21) Appl. No.: 12/234,155

(22) Filed: Sep. 19, 2008

(65) Prior Publication Data

US 2009/0080097 A1    Mar. 26, 2009

Related U.S. Application Data

(60) Provisional application No. 60/974,050, filed on Sep. 20, 2007, provisional application No. 60/974,043, filed on Sep. 20, 2007, provisional application No. 60/974,055, filed on Sep. 20, 2007.

(51) Int. Cl.
 C23F 1/00      (2006.01)
 H01L 21/00    (2006.01)
 B81C 1/00     (2006.01)

(52) U.S. Cl. .......... 216/2; 216/79; 216/99; 438/29; 438/770; 438/791

(58) Field of Classification Search .......... 216/2, 33, 216/36, 41, 51, 67, 79, 83, 99; 438/29, 53, 438/770, 783, 791
See application file for complete search history.

(56) References Cited

U.S. PATENT DOCUMENTS

| | | | | |
|---|---|---|---|---|
| 4,845,048 A | * | 7/1989 | Tamaki et al. | 438/410 |
| 4,999,312 A | * | 3/1991 | Yoon | 438/392 |
| 6,051,866 A | * | 4/2000 | Shaw et al. | 257/417 |
| 6,093,330 A | * | 7/2000 | Chong et al. | 216/2 |
| 6,355,181 B1 | * | 3/2002 | McQuarrie | 216/2 |
| 6,551,944 B1 | * | 4/2003 | Fallica et al. | 438/719 |
| 6,827,869 B2 | * | 12/2004 | Podlesnik et al. | 216/17 |
| 6,833,079 B1 | * | 12/2004 | Giordani | 216/2 |
| 7,537,994 B2 | * | 5/2009 | Taylor et al. | 438/259 |
| 7,582,532 B2 | * | 9/2009 | Han et al. | 438/270 |
| 2001/0044165 A1 | | 11/2001 | Lee et al. | |

FOREIGN PATENT DOCUMENTS

WO    2006/114127    11/2006

OTHER PUBLICATIONS

International Search Report for Application PCT/EP208/062641, mailed May 14, 2009.
Bring, M. et al., "Novel Monocrystalline Silicoin Micromirrors for Maskless Lithography", Solid-State Sensors, Actuators and Microsystems Conference, 2009, Transducrers, 2007, International IEEE, Piscataway, NJ, US, Jun. 10, 2007, pp. 1083-1086.
Arney S.C. et al., "Formation of Submicron Silicon-on-Insulator Structures by Lateral Oxidation of Substrate-Silicon Islands", Journal of Vacuum Science & Technology, Part B, AVS/AIP, vol. 6 No. 1, Jan. 1, 1988, pp. 341-345.
International Prelimnary Report on Patentability for Application PCT/EP208/062641, mailed Oct. 5, 2010.

* cited by examiner

Primary Examiner — Mark Consilvio
(74) Attorney, Agent, or Firm — Haynes Beffel & Wolfeld LLP; Ernest J. Beffel, Jr.

(57) ABSTRACT

A novel silicon micromirror structure for improving image fidelity in laser pattern generators is presented. In some embodiments, the micromirror is formed from monocrystalline silicon. Analytical- and finite element analysis of the structure as well as an outline of a fabrication scheme to realize the structure are given. The spring constant of the micromirror structure can be designed independently of the stiffness of the mirror-surface. This makes it possible to design a mirror with very good planarity, resistance to sagging during actuation, and it reduces influence from stress in reflectivity-increasing multilayer coatings.

8 Claims, 6 Drawing Sheets

- ▨ Monocrystalline silicon
- ▥ Silicon oxide
- ▨ Resist
- ▨ Electrode
- ☰ Mo/Si multilayer

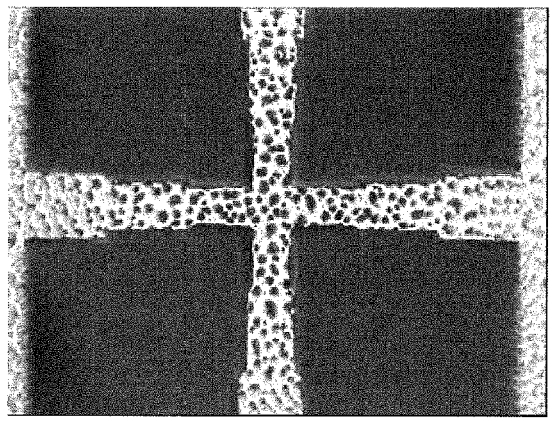
FIG. 6A  50 μm
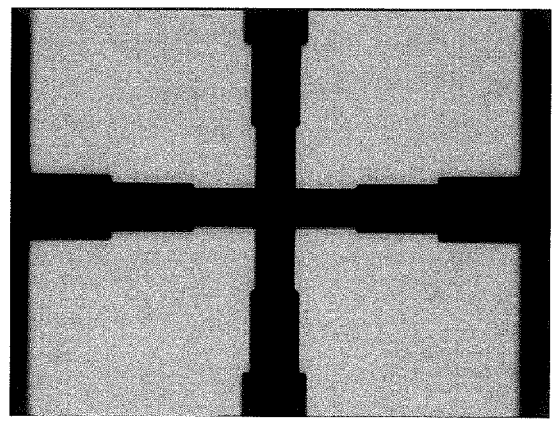
FIG. 6B  50 μm
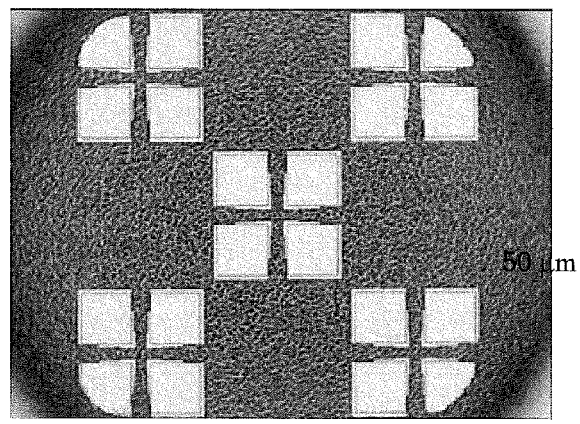
250 μm
FIG. 7A
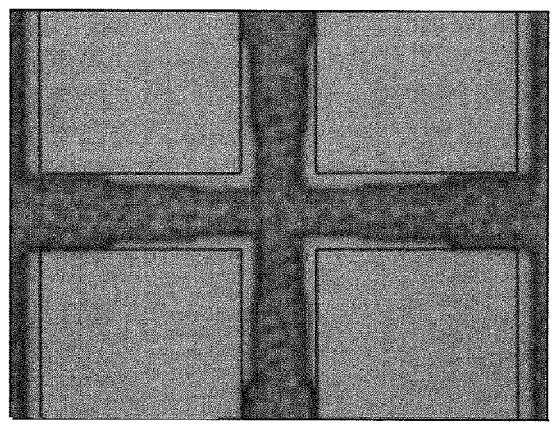
50 μm
FIG. 7B

US 7,981,303 B2

METHOD OF MANUFACTURING MONOCRYSTALLINE SILICON MICROMIRRORS

RELATED APPLICATION

This application claims priority in part from U.S. Provisional Application No. 60/974,050, filed 20 Sep. 2007; and in part from U.S. Provisional Application No. 60/974,043, filed 20 Sep. 2007. This application also claims priority in part from U.S. Provisional Application No. 60/974,055, filed 20 Sep. 2007. These three provisional applications are hereby incorporated by reference for all purposes.

BACKGROUND OF THE INVENTION

The present invention relates to a method of manufacturing a support post with a predetermined flexure thickness. In particular, it relates to growing oxide in defined chambers on opposite sides of the support post until the oxide growth fills the chambers, thereby slowing the oxide growth. A further embodiment includes a novel alignment mark and method, which are useful in aligning and assembling microstructures.

Maskless lithography using micromirror-based laser pattern generators is a potential technology to solve a range of challenges related to the continued device scaling in the semiconductor industry [1]. Both economical and technological incentives make micromirror-based lithography very promising when going to extreme ultraviolet (EUV) wavelengths. However, shorter wavelength increases the requirements on the micromirror structure, e.g. planarity, sagging, surface-roughness and stability [2-4]. For example the requirements for the high spatial frequency surface roughness $HSFR \leq 0.15$ nm [5] is quite demanding but can be achieved on silicon.

An opportunity arises to improve the design and formation of micromirrors and other micro machines. Better, more easily configured and controlled methods and micro structures may result.

SUMMARY OF THE INVENTION

A novel silicon micromirror structure for improving image fidelity in laser pattern generators is presented. In some embodiments, the micromirror is formed from monocrystalline silicon. The spring constant of the micromirror structure can be designed independently of the stiffness of the mirror-surface. This makes it possible to design a mirror with very good planarity, resistance to sagging during actuation, and it reduces influence from stress in reflectivity-increasing multilayer coatings.

A photograph of a realized free hanging alignment mark is shown in FIG. 6, in light and dark field conditions.

An overview photograph of aligned structures can be seen to the left in FIG. 7A and a close up of the middle mark is shown to the right. FIG. 7B.

Figure 8A:
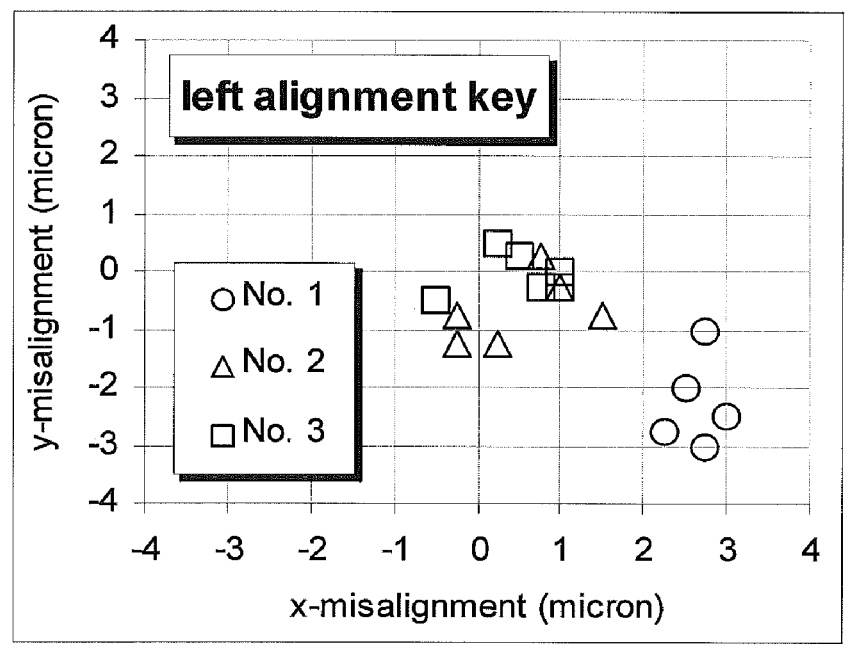
Figure 8B:
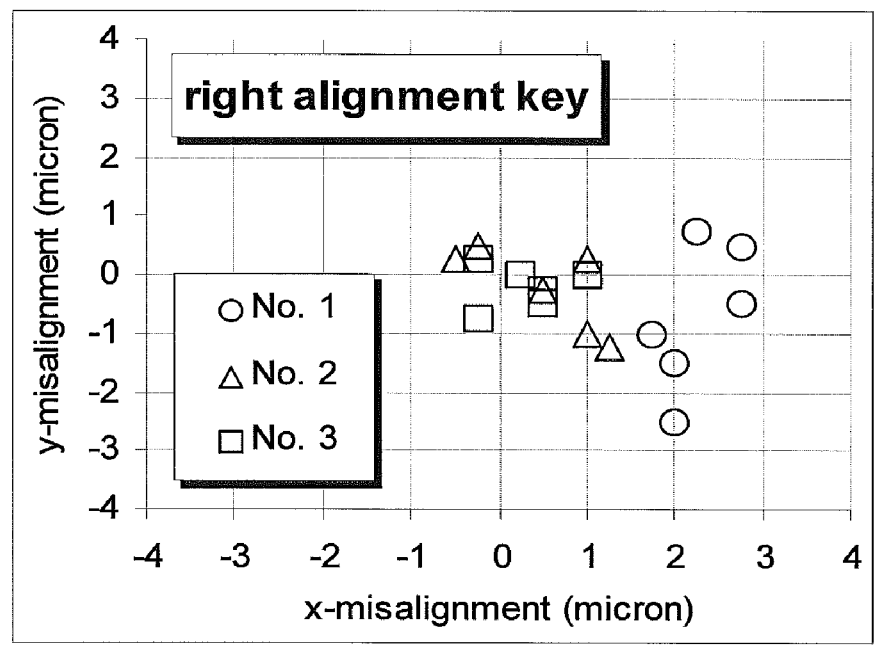

Measured misalignments for the three tests are plotted in FIGS. 8A-8B.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Monocrystalline Silicon Mirrors in an SLM

Introduction

Figure 1:
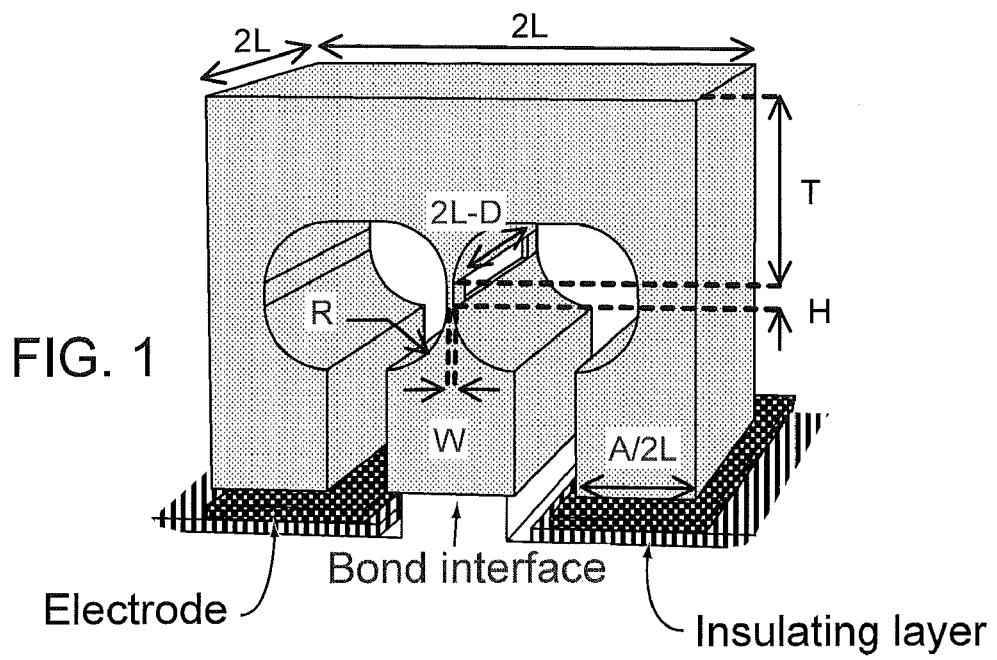
FIG. 1 illustrates a monocrystalline silicon micromirror structure.

We propose a novel silicon micromirror structure that is illustrated in FIG. 1, to meet the increased requirements. In some embodiments, the micromirror is formed from monocrystalline silicon.

The majority of all present micromirrors are made by surface micromachining, especially with aluminum. However, deposited aluminum is known for mechanical memory effects [7,8]. By using bulk-micromachining and low-temperature transfer bonding we can use monocrystalline silicon (with excellent mechanical properties) as the structural material. The proposed micromirror includes two vertically standing flexure hinges that can be defined independently of the thickness of the top part of the mirror, see FIG. 1. This gives a very stable mirror surface that is not easily deformed, e.g. during actuation or by stress in reflectivity-increasing multilayer coatings. The hinges are hidden under the mirror surface which gives a high fill-factor. With this design, Rms values below 0.1 nm have been demonstrated for reflectivity-increasing Mo/Si multilayers on monocrystalline silicon [6].

Fabrication Outline

Figure 2:
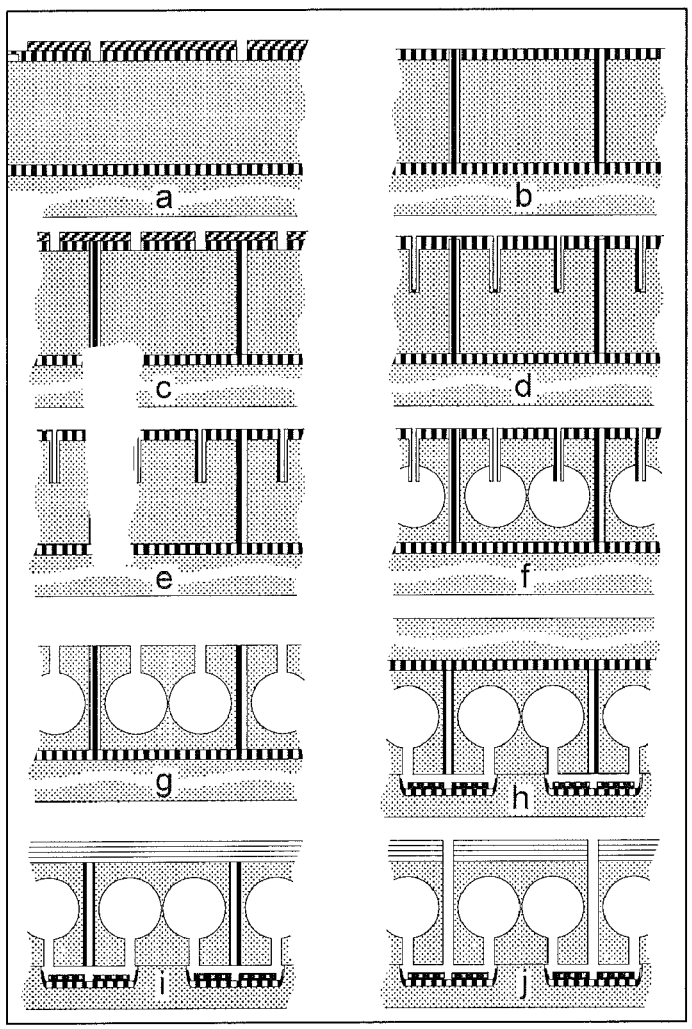
FIG. 2 outlines a fabrication scheme for a micromirror.

The process used to build the proposed monocrystalline mirror structure provides good hinge-dimension control, high post bond alignment accuracy, and low mirror surface roughness. An outline of a proposed fabrication scheme can be seen in FIG. 2. The starting material is a silicon-on-insulator (SOI) substrate. The FIGURE illustrates fabricating mirrors on a first wafer, inverting the wafer and boding it to a second wafer. The first wafer (FIGS. 2A-2G) is inverted after fabrication and bonded to the second wafer. FIG. 2H. The steps can be briefly outlined as: a) patterning of oxide; b) DRIE and planarization by oxide deposition and CMP; c) patterning of oxide; d) shallow trench etching and oxide deposition; e) highly anisotropic RIE; f) hidden-hinge definition; g) vapor HF-etching; h) low temperature aligned bonding; i) etch back of handle wafer and deposition of multilayer stack; j) patterning of multilayer and releasing of mirrors.

For large mirrors, the hinge definition step, FIG. 2F, could be an isotropic etch making the process very similar to the SCREAM process [9]. For very small mirrors, the use of a lateral oxidation scheme could give good dimension control. The possibility of creating hinge widths down to 10 nm has been shown [10].

Reduction in the size of the mirrors fabricated is currently limited by the post bond alignment accuracy, the step depicted in FIG. 2H. Systems for nanoprecision alignment accuracy have been reported [11], which currently limit the mirror size to around $2 \times 2$ $\mu m^2$, due to requirements for sufficient space for both electrodes and bond area beneath the mirror. In the bonding step, low temperature plasma assisted fusion bonding can be used to achieve high strength bonds on small areas [12]. This bond method does not need a high applied force to achieve bonding. Lower pressures are desirable, because a large downward force could potentially destroy the thin fragile hinge post (the center post).

Low mirror surface roughness after removal of the buried oxide (BOX), FIG. 2I, can be achieved by using vapor HF-etching [13].

High reflectivity is critical for the intended application. Mo/Si multilayer coatings can be used to achieve reflectivity up to ~70% [6]. The deposition and patterning of the reflectivity increasing multilayer stack can be performed after removal of the BOX. The final release of the mirrors can again be done by vapor HF-etching with an additional etch stop material [13].

The Lateral Oxidation Scheme to Form the Hidden Hinge

The starting substrate for this process can be silicon or any other material in which it is possible to selectively grow an oxide. In one embodiment of this process, the substrate would be silicon and mask materials 1, 2, and 3 would be silicon oxide, silicon nitride, and e-beam resist, respectively.

Figure 4:
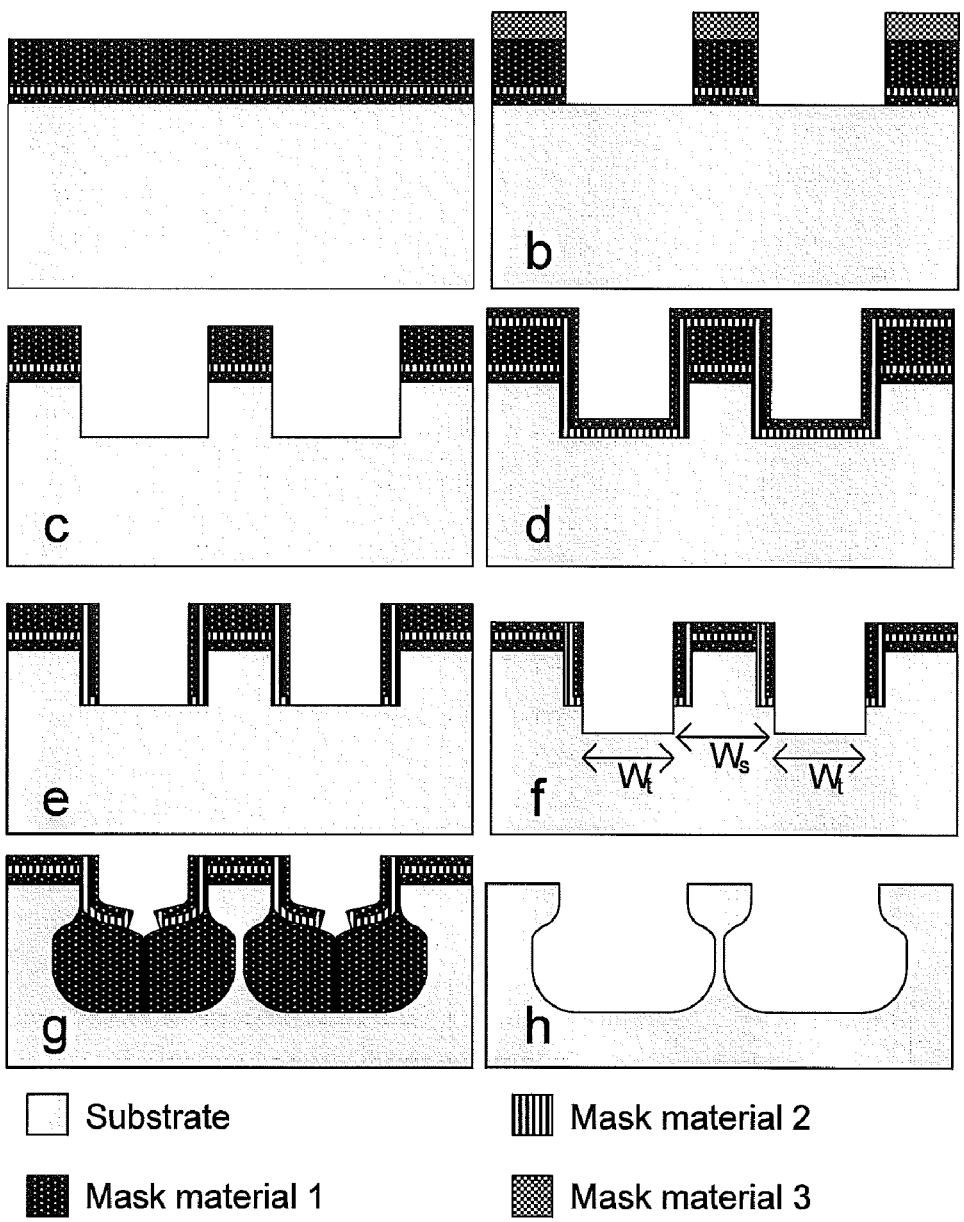
FIG. 4 depicts some of the steps leading to an oxidation to form a hidden hinge.

FIG. 4A: Start with thermally growing a thin oxide on the silicon substrate to protect the silicon surface during the continued processing, as well as create a stress relaxation layer for the deposited silicon nitride. Next deposit a layer of silicon nitride (not illustrated) and a thicker layer of silicon oxide. The nitride will protect the underlying silicon during the oxidation step in FIG. 4G. The oxide layer will act as a mask in the coming etch steps and protect the underlying nitride layer.

FIG. 4B: Pattern the oxide and nitride layers. For example, apply standard photolithography or e-beam direct writing, followed by a dry etch, such as reactive ion etching (RIE).

FIG. 4C: The following silicon etch can also be performed by dry etching like RIE in which the resist and the thicker silicon oxide layer acts as the mask. This etch needs to be deep enough. If not, the oxidation step in FIG. 4G will consume much of the silicon between the silicon trenches resulting in a widening of the top of the final trenches.

FIG. 4D: Next deposit a thin layer of silicon nitride and a thin layer of silicon oxide. Once more the thin nitride will protect the underlying silicon during the coming oxidation step in FIG. 4G. The deposited oxide will protect the underlying nitride in the subsequent etch steps.

FIG. 4E: Remove the oxide and nitride on the horizontal surfaces, for instance by anisotropic dry etching, such as RIE. The oxide and nitride in the bottom of the trenches are removed to expose the substrate to the following silicon etch.

FIG. 4F: The silicon etch can once more be achieved by dry etching like RIE. The depth of this etch defines the height of the hidden hinge.

FIG. 4G: Thermal oxidation will cause an oxide to grow on the silicon not protected by nitride. The oxide growth will consume silicon equal to around 44% of the created oxide thickness as the chamber at the bottom of the trench fills with oxide. By choosing a width of the trenches, Wt and the size of the chamber at the bottom of the trenches that is matched to the separation distance, WS, between them it is possible to achieve a significantly lower oxidation rate between the trenches, which in turn will make it easier to achieve good dimension control of the width of the hidden hinge before all silicon between the trenches is consumed.

FIG. 4H: Remove the grown oxide, for instance by a buffered oxide etch (BOE). The BOE etches nitride relatively slowly. The nitride can subsequently be removed, for example by hot phosphoric acid. This should leave the thin oxide grown in FIG. 4A in tact. For the previously described mirror structure, the processing can be continued from FIG. 2F.

EUV Mirror Case Study

The maximum deflection required of a tilting EUV mirror is around 5 nm. We now consider a proposed mirror structure with the following dimensions: W=30 nm, H=50 nm, L=1 µm, T=700 nm, D=500 nm, $G_0$=25 nm, A=0.5×2 µm². The parameters are summarized in following table under Case 1 where also the parameters for a second case are given:

| Parameter | Case 1 | Case 2 | Unit |
|---|---|---|---|
| W | 30 | 45 | nm |
| H | 50 | 50 | nm |
| L | 1000 | 1000 | nm |
| T | 700 | 700 | nm |
| D | 500 | 500 | nm |
| $G_0$ | 25 | 30 | nm |
| A | 0.5 × 2 | 0.5 × 2 | µm² |
| R | 250 | 250 | nm |
| E | 165 | 165 | GPa |
| ν | 0.3 | 0.3 | — |

These parameters are believed to be realistic and achievable using existing micromachining processes. The width of the hinge and the electrode gap are parameters that have a heavy influence on the performance. Case 2 has a 50% wider hinge and 20% larger electrode gap compared to case 1. This illustrates the influence of fabrication related artifacts. The impact of the bond misalignment which is another fabrication related parameter is largest when Δm<0. Therefore a negative value of Δm has been chosen to illustrate the influence of this parameter. Alignment accuracies of ±200 nm have been shown [11] and consequently the analyzed misalignment is Δm=−200 nm.

To see the impact of simplifications in the analytic analysis, a comparison to finite element analysis ("FEA") was performed. FEA of δ(V, Δm), kθ, Stot, Δδ, and crosstalk for the two cases have been performed in COMSOL Multiphysics [15]. When simulating electrostatic forces all mirrors are grounded and the actuation potential is applied to the substrate electrode.

Plane strain is valid in this case study since D is large compared to W. The numerical angular spring constant, kθ,NUM, for the two cases, kθ,NUM,case1=1.37 pNm and kθ,NUM,case2=4.00 pNm, agree rather well with the FEA values, kθ,FEA,case1=1.31 pNm and kθ,FEA,case2=3.75 pNm. The numerical value for case 1 is 3.8% larger than the FEA value and for case 2 it is 6.7% larger.

Figure 3A:
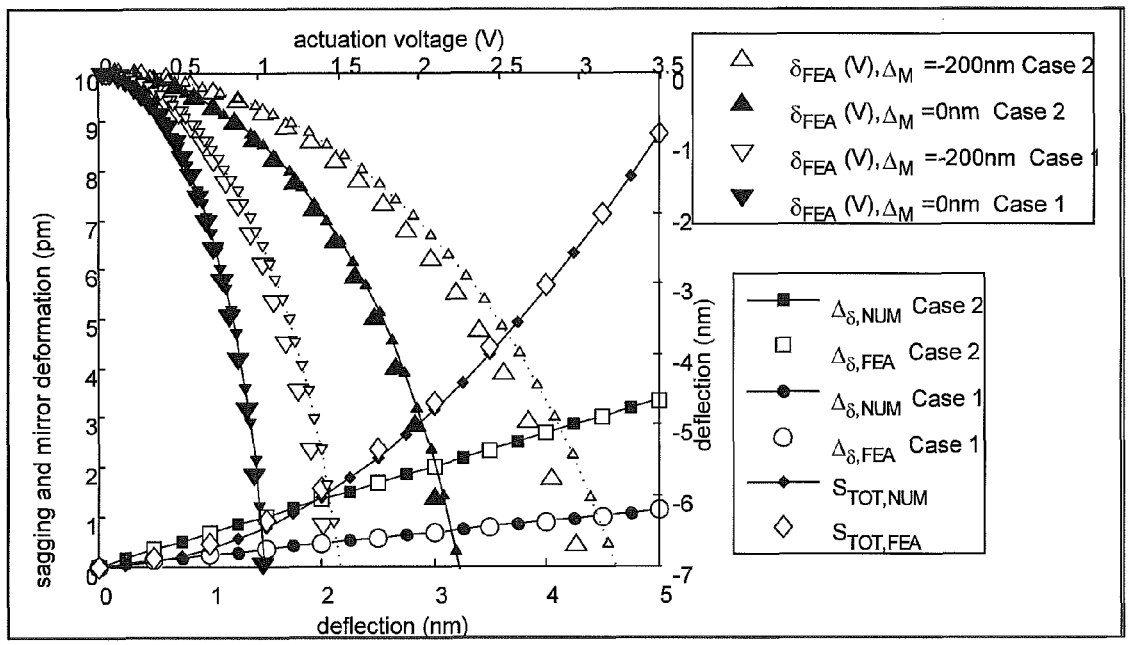
FIG. 3A plots $\delta(V, \Delta m)$, $\Delta\delta(\delta)$, and $S_{tot}(\delta)$ for the two cases.

FIG. 3A shows δ(V, Δm), Δδ(δ), and Stot(δ) for the two cases. FEA values are also plotted in FIG. 3A. The FEA agree very well with the results from the analytic analysis. The overestimation of the required actuation voltage to achieve a certain deflection is mainly due to fringing effects which are not modeled in the numerical analysis. Both the sagging and the mirror-surface deformation is less than 0.2% of the deflection.

An investigation of the mirrors' sensitivity to crosstalk between adjacent mirrors has also been carried out by FEA. The magnitude of the crosstalk depends primarily on the bond misalignment but also on the mirror separation distance. The bond misalignment is Δm=+200 nm for the plotted crosstalk since a positive misalignment gives the largest crosstalk due to the relatively smaller electrode distance. By having a mirror separation distance larger than 210 nm the crosstalk is limited to less than 0.5% of the actuated mirror's deflection for both cases.

Discussion

3D FEA of electrostatic actuated structures is very computational demanding. The data are from 2D simulations. In addition, pure electrostatic and structural mechanic 3D simulations have been performed to check the validity of the 2D simplification. The 3D and 2D electrostatic forces agree very well suggesting that the fringing effects at the extreme ends of the electrodes are negligible. 2D and 3D simulations of the angular spring constant also agree very well as long as D/2L is sufficiently large so that plane strain can be assumed. This shows that the 2D simplification is valid.

The analytic result of $k\theta$ also agrees fairly well with the FEA. However, analysis gives a more than 20% larger kh compared to the FEA. This is because the hinge is not slender enough, i.e. the ratio H/W is too small. An error of less than 5% requires $H/W \geq 8$ [14]. However, this error does not affect $k\theta$ to that extent since kh is just one part of the total angular spring constant.

For a realistic EUV mirror, the actuation voltage will be limited to a few volts due to the underlying electronics. FIG. 3A shows that for case 1 the maximum required deflection of 5 nm is achieved for an actuation voltage of around 0.95 V. A bond misalignment of $\Delta m = -200$ nm increases the required voltage by +0.35 V to 1.3 V. For case 2, using a 50% wider hinge and 20% larger initial electrode gap, the actuation voltage at 5 nm deflection is 2 V. For this case, a bond misalignment of $\Delta m = -200$ nm shifts the required voltage by +0.7 V to 2.7 V. Increasing the hinge width and initial electrode gap more than doubles the maximum required voltage. Nevertheless, even with these fabrication related artifacts the maximum required voltage is still less than 3 V.

Figure 3B:
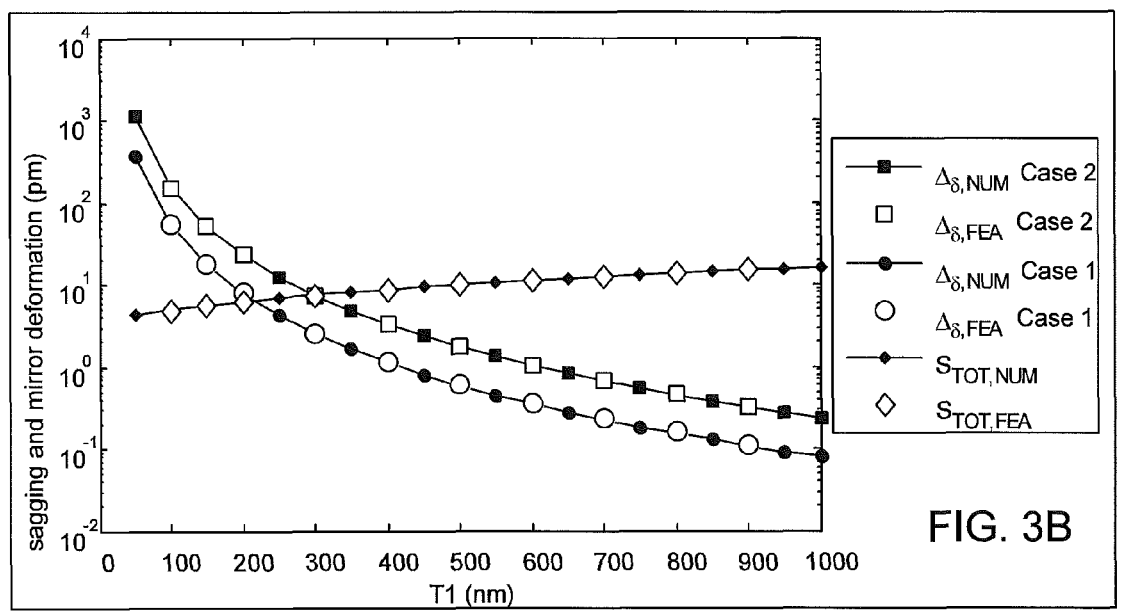
FIG. 3B plots analytical and FEA values of the sagging and mirror deformation versus the thickness of the top part of the mirror.

There is a trade off between the magnitude of the sagging and the mirror surface deformation since a thicker mirror gives a larger sagging but also a smaller deformation. This is shown in FIG. 3B where analytical and FEA values of the sagging and mirror deformation versus the thickness of the top part of the mirror is plotted. The data in FIG. 3B is for a mirror deflection of 5 nm.

The deflection of the adjacent mirror is both positive and negative depending on the separation distance. This is due to fringing effects creating electrostatic forces in the negative x-direction on the lower part of the adjacent mirror's electrode. The torque on the hinge due to these forces is of opposite sign and larger than the torque due to forces in the negative y-direction until the separation distance is sufficiently small.

Crosstalk is sensitive to the separation distance when the separation is close to the bond misalignment. Hence to decrease the sensitivity to misalignment it is wise to choose a separation distance that is somewhat larger than the maximum expected bond misalignment. However it is desirable to have a high fill factor as well so the mirror pitch should be as small as the crosstalk allows. For a mirror size of 2 μm and a mirror separation distance of 225 nm the fill factor is larger than 80%.

Submicron Bond Alignment Accuracy Using Through-Wafer Holes

We present an easy to implement and simple method to achieve submicron bond alignment accuracy for non-transparent substrates. The method uses through-wafer etched holes to reveal the alignment marks in the bond interface during alignment. Three different bond aligner settings are tested; wedge error compensation (WEC) with and without spacers and different alignment gaps. By using WEC with 200 μm thick spacers and an alignment gap of 100 μm, it is possible to achieve submicron bond alignment accuracy for non-transparent substrates.

Introduction

Accurate aligned bonding of two structured wafers is an enabling technology in micromachining of micro electromechanical systems (MEMS) [1-5]. Aligned bonding has also attracted attention for use in the integrated circuit industry to create 3D interconnects [6,7]. A number of different more or less successful alignment methods exists encompassing infrared alignment, transparent substrates, through-wafer via holes, wafer backside alignment, intersubstrate alignment microscope, and the SmartView™ [8]. In general, the bond alignment becomes more difficult and less accurate when using non-transparent substrates.

The method presented herein is an improvement of the method using through-wafer via holes and is suitable for non-transparent substrates. Through-wafer holes have been used to define alignment keys that are visible from both sides of the wafer. This gives the possibility to align non-transparent substrates, e.g. silicon, as if they were transparent. However, the method creates very bulky non-precise alignment marks since they are defined on the backside and etched through the wafer, typically using anisotropic wet etch.

Using particular mechanical passive alignment structures has recently been shown to produce nanoprecision alignment accuracies of better than 200 nm [9]. Our method is less complicated but still offers relatively high alignment precision.

Figure 5:
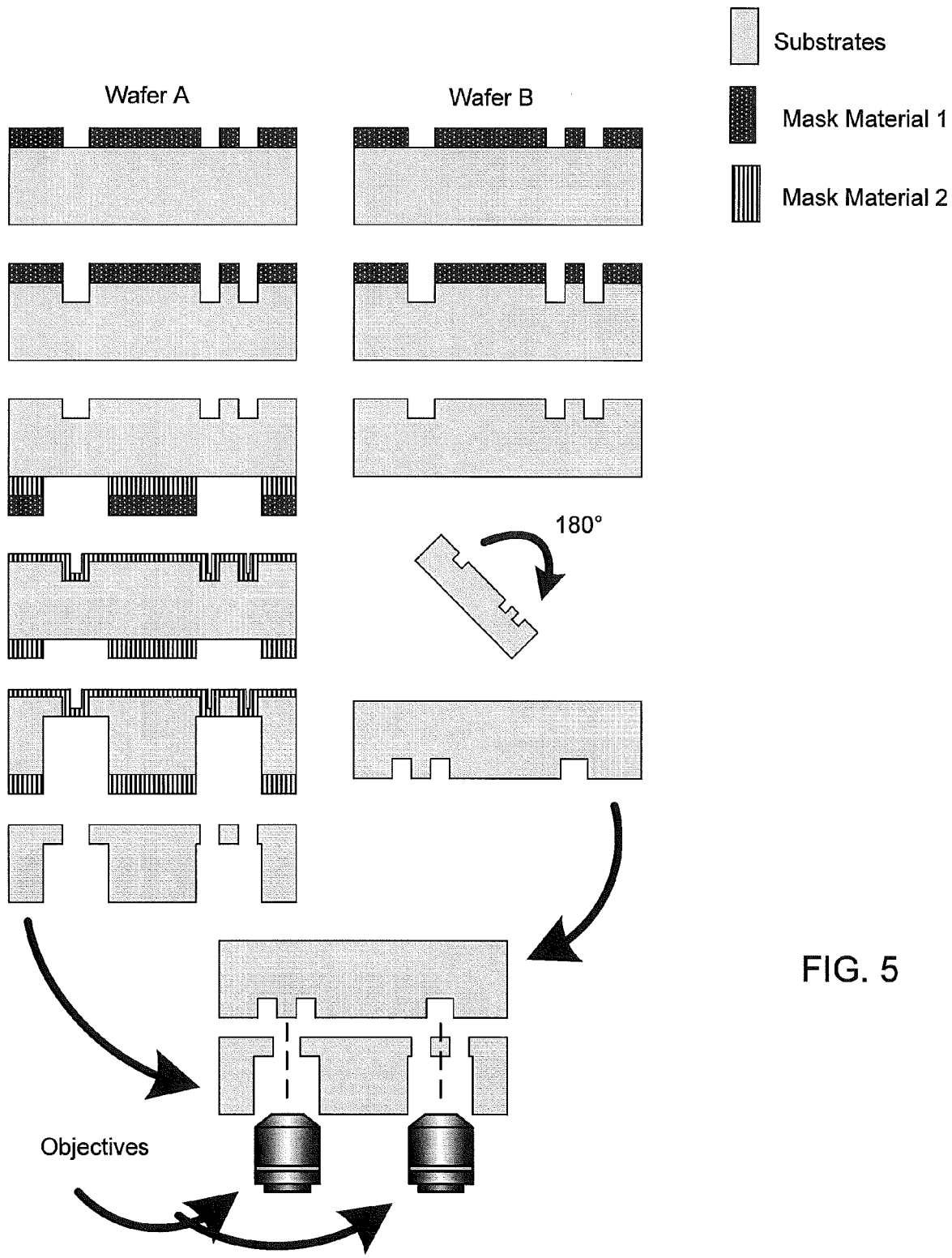
FIG. 5 illustrates defining the alignment keys on the front side and revealing them by through-wafer via holes.

Our method defines the alignment keys on the front side and reveals them by through-wafer via holes, as illustrated by FIG. 5. Using this approach, it is possible to achieve submicron alignment accuracy.

EXPERIMENTAL

Alignment keys as well as x- and y-direction vernier scales with a designed resolution of 250 nm were patterned on the front side of two substrates. The patterning was in this case done by using standard photolithography and photoresist was used as the mask material 1 as shown in FIG. 5. The substrates used here were 150 mm silicon wafers. A single photomask was used for both wafers in order to remove any errors from mask fabrication. By using deep reactive ion etching (DRIE), the alignment keys on both substrates were etched to a depth of 20 microns.

For mask material 2, we used a 500 nm aluminum thick film that was sputtered on the backside of wafer A. The aluminum was patterned using double sided lithography and aluminum wet etch to create the pattern for the through-wafer via holes. A layer of 200 nm aluminum was sputtered on the front side of this wafer to maintain pattern dimensions during through-wafer etch. The via holes were etched by DRIE to reveal the alignment marks on the front side.

This approach is useful for substrates other then silicon wafers; for example, metal. Mask material 1 and 2 are not limited to the above mentioned materials but could for example be dielectrics like silicon oxide and silicon nitride or metals like tungsten and gold or polymers like BCB and SU-8.

The wafers were aligned using a Karl Süss BA6. Three different settings of alignment gap and wedge error compensation (WEC) were used to check the influence on the alignment accuracy. The settings for the tests are summarized in the table below. The spacer thickness was 200 μm and all tests were clamped without spacers after alignment. The same wafer-pair was used for all tests. The alignment was performed 6 times for each setting and the x and y misalignment was measured using the vernier scales.

| Test id. | WEC | Al. gap |
|---|---|---|
| No. 1 | with spacers | 250 μm |
| No. 2 | without spacers | 250 μm |
| No. 3 | with spacers | 100 μm |

Results

A photograph of a realized free hanging alignment mark is shown in FIG. 6A. To illustrate the through-wafer holes, the same mark is shown in FIG. 6B (right) using backlight. The rough surface is due to the DRIE. An overview photograph of aligned structures can be seen to the left in FIG. 7A and a close up of the middle mark is shown to the right. FIG. 7B. The smallest distance between the two different marks is 1 μm. As can be seen from FIGS. 7A-7B, it is possible to distinguish both marks even at the 1 μm distance suggesting submicron alignment accuracy.

By using the vernier scales the x and y misalignment could be measured with a resolution of 250 nm. The measured misalignments for the three tests are plotted in FIGS. 8A-8B. A summary of the standard deviation and the average value of the absolute misalignment at the left and right alignment key are presented in the table below. The distance between the left and right alignment key was 80 mm.

| | Standard deviation (μm) | | | |
|---|---|---|---|---|
| | left key | | right key | |
| Test id. | x | y | x | y |
| No. 1 | 0.26 | 0.77 | 0.42 | 1.23 |
| No. 2 | 0.71 | 0.58 | 0.72 | 0.72 |
| No. 3 | 0.57 | 0.37 | 0.49 | 0.38 |

| | Average absolute misalignment (μm) | | | |
|---|---|---|---|---|
| | left key | | right key | |
| Test id. | x | y | x | y |
| No. 1 | 2.67 | 2.38 | 2.25 | 1.13 |
| No. 2 | 0.67 | 0.75 | 0.75 | 0.58 |
| No. 3 | 0.67 | 0.29 | 0.46 | 0.29 |

Discussion

When designing alignment marks for this method, it is useful to have some connection points to the substrate to make the structure mechanical stable. However the membranes in our study were thinner than 20 μm, had a diameter of 1.5 meter, and the smallest feature size was 20 μm wide.

Example of Application

The mirror structure mentioned in previous section is described in a little more detail here. It is intended for use in maskless lithography. Maskless lithography using micromirror-based laser pattern generators is a potential technology to solve a range of challenges related to the continued device scaling in the semiconductor industry [12]. Both economical and technological incentives make micromirror-based lithography very promising when going to extreme ultraviolet (EUV) wavelengths. However, shorter wavelength increases the requirements on the micromirror structure, e.g. planarity, sagging, surface-roughness and stability [13-15]. For example the requirements for the high spatial frequency surface roughness HSFR≦0.15 nm [16] is quite demanding but can be achieved on silicon. Rms values below 0.1 nm have been demonstrated for reflectivity-increasing Mo/Si multilayers on monocrystalline silicon [17].

High reflectivity is critical for the intended application. Mo/Si multilayer coatings can be used to achieve reflectivity up to ~70% [17]. The deposition and patterning of the reflectivity increasing multilayer stack can be performed after removal of the BOX. The final release of the mirrors can again be done by vapor HF-etching with an additional etch stop material [23].

CONCLUSIONS

A simple method suitable for non-transparent substrates achieving submicron bond alignment accuracy has been presented. The method can be used together with a wide range of bonding techniques, e.g. fusion bonding, adhesive bonding, and eutectic bonding. By using SOI wafers, it is easier to produce a clean alignment mark. Submicron alignment accuracy is achieved even without using SOI wafers.

SOME PARTICULAR EMBODIMENTS

The present invention may be practiced as a method of manufacture or a manufactured device.

One embodiment is a method of manufacturing a support post with a predetermined flexure thickness. This method includes forming a first silicon layer. In some embodiments, the first silicon layer is monocrystalline silicon. It proceeds with patterning the first layer to define at least one structure with a tableau, a center leg connected to and oriented essentially perpendicular to the tableau, and trenches on opposing sides of the center leg. It includes forming at least one protective layer along sides of the trenches and defining chamber areas that have predetermined dimensions on opposing sides of the center leg and that extend below the trenches and/or their protective layers. An oxide layer is grown in the chamber areas, thereby consuming monocrystalline silicone from the opposing sides in the center leg at a rate that slows when the oxide layer fills and closes the chamber areas. The growth of the oxide layer in the chamber areas is completed after the center leg has been narrowed by the consumption of monocrystalline silicon to a predetermined flexure thickness of the center leg. This happens as the oxide layer combines the consumed silicon with oxygen from the reaction chamber, filing the chamber with the resulting thickness of oxide that is greater than the thickness of the consumed silicon. Filing the chamber with oxide leads to a greatly reduced oxidation rate, whether due to mechanical forces, to separation of the silicon material from the oxidizing atmosphere or to some other mechanism.

One aspect of this method further includes defining a height of the center leg by controlling the patterning to define the depth of trenches on opposing sides of the center leg. Another aspect, which may be combined with the first aspect, further includes defining the predetermined dimension of the chamber areas such that an extent of the narrowing of one side of the center leg during the growth of the oxide layer is between 40 and 50 percent of the thickness of the oxide layer, when the oxide layer is measured after growth from the centerline of the chamber area to a boundary between the monocrystalline silicone of the center leg and the oxide layer. More particularly, the extent of the narrowing may be about 44 percent of the thickness of the oxide layer. By about 44 percent, we mean within a tolerances 3, 2 or 1 percent.

A further aspect of this method includes removing the oxide layer. This removal may be accomplished using a buffered oxide etch. The protective layer along the trench sides may include silicon nitride.

Another embodiment is a micro mirror device. This micro mirror device includes a monocrystalline silicon structure having three legs generally perpendicular to the tableau. The tableau reflects radiation or underlies a reflective layer. The center leg is bonded at an end distal to the tableau to a substrate. Two legs on opposing sides of the centerline are separated by a gap at the distal lands from two electrodes positioned on or in the substrate that are adapted to attract or repel the two legs. The center leg has a narrow section that facilitates flexure when the electrodes act on one or more of the two legs on the opposing sides.

According to one aspect of this device embodiment, the narrowed section may be 10-20 nanometers thick, when measured along a radius of flexure.

A further embodiment as a method of aligning first and second workpieces. This method includes applying to the first workpiece a symmetrical alignment mark having arms that are tapered towards the center of the mark. It includes positioning a second workpiece relative to the first workpiece. The second workpiece has an opening adapted to view at least part of the alignment mark. The method continues with aligning the first and second workpieces based on a view of the alignment mark through the opening.

One aspect of this method produces an alignment accuracy in a range of 0.26 to 2.67 microns, as measured using a vernier scale with a resolution of 250 nanometers. It is contemplated that modifications and combinations will readily occur to those skilled in the art, which modifications and combinations will be within the spirit of the invention and the scope of the following claims.

REFERENCES

[1] P. Kruit, "The role of MEMS in maskless lithography," Microelectronic Engineering, 84 (2007) 1027-1032.
[2] Ulric Ljungblad, Hans Martinsson, and Torbjörn Sandstrom, "Phase shifted addressing using a spatial light modulator," Microelectronic Engineering, 78-79 (2005) 398-403.
[3] Shinji Miyagaki, Hiromasa Yamanashi, Atsuko Yamaguchi et al., "Influence of glass substrate surface roughness on extreme ultraviolet reflectivity of Mo/Si multilayer," presented at the 48th International Conference on Electron, Ion, and Photon Beam Technology and Nanofabrication, San Diego, Calif. (USA), 2004.
[4] P. P. Naulleau, "Effect of mask-roughness on printed contact-size variation in extreme-ultraviolet lithography," Applied Optics, 44 (2005) 183-189.
[5] SEMI P37-1102 Semiconductor Equipment and Materials International, 2002.
[6] E. Spiller, "High-performance multilayer coatings for EUV lithography," San Diego, Calif., USA, 2004.
[7] M. R. Douglass, "Lifetime estimates and unique failure mechanisms of the Digital Micromirror Device (DMD)," presented at the 1998 IEEE International Reliability Physics Symposium 36th Annual, Reno, Nev., USA, 1998.
[8] Hoo-Jeong Lee, Guido Cornella, and John C. Bravman, "Stress relaxation of free-standing aluminum beams for micro electromechanical systems applications," Applied Physics Letters, 76 (2000) 3415-3417.
[9] Kevin A. Shaw, Z. Lisa Zhang, and Noel C. MacDonald, "SCREAM I: a single mask, single-crystal silicon process for micro electromechanical structures," presented at the Micro Electro Mechanical Systems, Fort Lauderdale, Fla., USA, 1993.
[10] S. C. Arney and N. C. MacDonald, "Formation of submicron silicon-on-insulator structures by lateral oxidation of substrate-silicon islands," presented at the 31st International Symposium on Electron, Ion, and Photon Beams, Woodland Hills, Calif., USA, 1988.
[11] Liudi Jiang, G. Pandraud, P. J. French et al., "Nanoprecision alignment for wafer bonding," presented at the MicroMechanics Europe Workshop, Southampton, UK, 2006.
[12] M. Bring, A. Sanz-Velasco, and P. Enoksson, "Method for measuring fracture toughness of wafer-bonded interfaces with high spatial resolution," Journal of Micromechanics and Microengineering, 16 (2006) 68-74.
[13] T. Bakke, J. Schmidt, M. Friedrichs et al., "Etch stop materials for release by vapor HF etching," presented at the Micromechanics Europe 2005-MME '05, Göteborg, 2005.
[14] Warren C Young, ROARK's Formulas for Stress & Strain, Vol. McGraw-Hill Book Company, 6th, 1989, pp. 763.
[15] COMSOL, (www.comsol.com).

We claim as follows:

1. A method of manufacturing a support post with a predetermined flexure thickness, including:
    forming a first silicon layer; patterning the first layer to define at least one structure with a tableau,
    a center leg connected to and oriented essentially perpendicular to the tableau, and trenches on opposing sides of the center leg; forming at least one protective layer along sides of the trenches;
    defining chamber areas of predetermined dimensions on opposing sides of the center leg extending below the trenches;
    growing an oxide layer in the chamber areas, thereby consuming monocrystalline silicon from the opposing sides of the center leg at a rate that slows when the oxide layer fills and closes the chamber areas; and
    completing the growth of the oxide layer in the chamber areas after the center leg has been narrowed by the consumption of the monocrystalline silicon to a predetermined flexure thickness of the center leg.

2. The method of claim 1, wherein the first silicon layer is monocrystalline silicon.

3. The method of claim 1, further including defining a height of the center leg by controlling the patterning to define the center leg.

4. The method of claim 1, further including defining the predetermined dimension of the chamber areas such that an extent of the narrowing of one side of the center leg during the growth of the oxide layer is between 40 and 50 percent of the thickness of the oxide layer, when the oxide layer is measured after the growth from a centerline of the chamber area to a boundary between the monocrystalline silicon of the center leg and the oxide layer.

5. The method of claim 4, wherein the extent of the narrowing is about 44 percent of the thickness of the oxide layer.

6. The method of claim 1, further including removing the oxide layer.

7. The method of claim 6, wherein the removing includes using a buffered oxide etch.

8. The method of claim 6, wherein the protective layer includes silicon nitride.

* * * * *